(12) United States Patent
Hirata et al.

(10) Patent No.: US 7,513,036 B2
(45) Date of Patent: Apr. 7, 2009

(54) METHOD OF CONTROLLING CONTACT LOAD IN ELECTRONIC COMPONENT MOUNTING APPARATUS

(75) Inventors: Shuichi Hirata, Osaka (JP); Yasuharu Ueno, Osaka (JP); Makoto Morikawa, Nara (JP); Hiroyuki Yoshida, Osaka (JP); Noriaki Yoshida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/596,218

(22) PCT Filed: Aug. 31, 2005

(86) PCT No.: PCT/JP2005/016376

§ 371 (c)(1),
(2), (4) Date: Jun. 5, 2006

(87) PCT Pub. No.: WO2006/025595

PCT Pub. Date: Mar. 9, 2006

(65) Prior Publication Data

US 2007/0056157 A1 Mar. 15, 2007

(30) Foreign Application Priority Data

Sep. 1, 2004 (JP) ............................. 2004-254532

(51) Int. Cl.
*H05K 3/30* (2006.01)
(52) U.S. Cl. .............................. 29/834; 29/742; 29/836; 324/754; 324/758; 324/765; 414/737; 414/749.3; 901/20
(58) Field of Classification Search ................... 29/593, 29/739, 740, 742, 743, 833, 834, 836; 324/758, 324/765, 754, 755; 414/737, 749.3; 901/20
See application file for complete search history.

(56) References Cited

U.S. PATENT DOCUMENTS

| | | | | |
|---|---|---|---|---|
| 4,927,320 | A * | 5/1990 | Olson | 414/814 |
| 6,233,497 | B1 * | 5/2001 | Kachi et al. | 700/173 |
| 6,445,201 | B1 | 9/2002 | Simizu et al. | |
| 7,153,186 | B2 * | 12/2006 | Popescu et al. | 451/6 |

FOREIGN PATENT DOCUMENTS

JP     2003-008196     1/2003

OTHER PUBLICATIONS

English Language Abstract of JP 2003-008196.

* cited by examiner

*Primary Examiner*—Paul D Kim
(74) *Attorney, Agent, or Firm*—Greenblum & Bernstein, P.L.C.

(57) ABSTRACT

A method of controlling contact load in an apparatus for mounting electronic components on a substrate, in which a head is lowered at high speed to slow down starting position where there is no risk that the electronic component makes contact with the substrate (S1), and from there the head is lowered at low speed until a predetermined target contact load is detected. The process of lowering the head at low speed includes the steps of moving down the head a predetermined distance (S3), measuring load after the step of moving down the head (S5), and determining whether the measured contact load has reached the target contact load (S9). The steps of moving down the head (S3) and measuring the load (S5) are repeated until the measured load reaches the target contact load. The actual load is precisely controlled to be close to a very small set level of target contact load. Accordingly, electronic components using low dielectric constant material are mounted without the risk of damage.

7 Claims, 7 Drawing Sheets

Prior Art
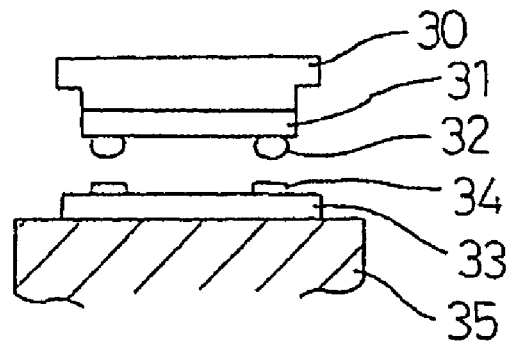
F i g . 5 A
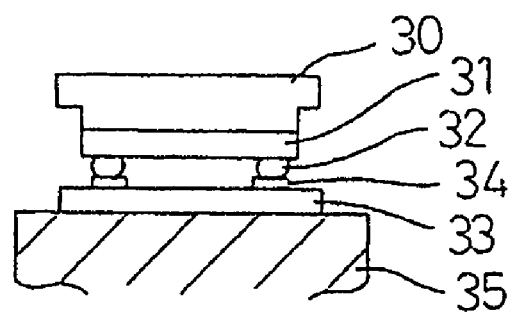
F i g . 5 B
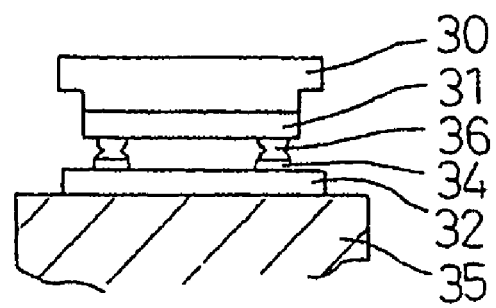
F i g . 5 C
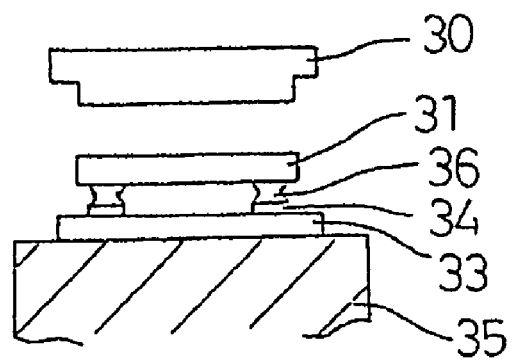
F i g . 5 D

Priort Art

Prior Art
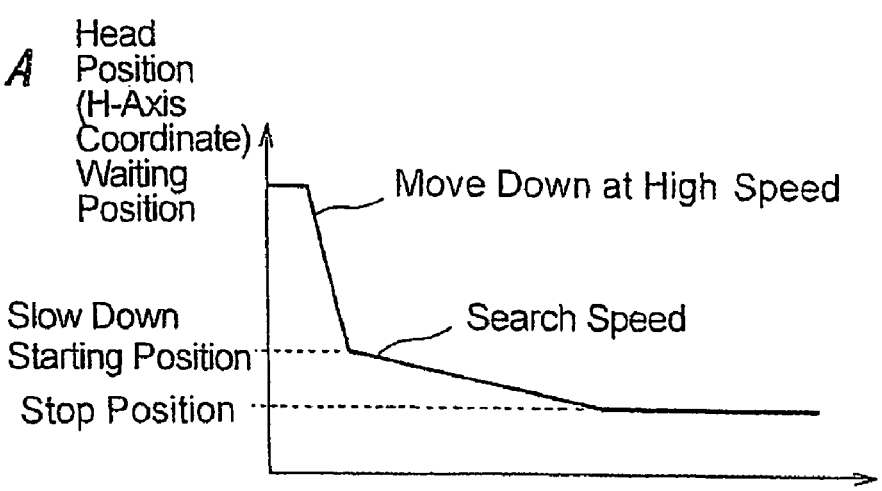
Fig. 7A
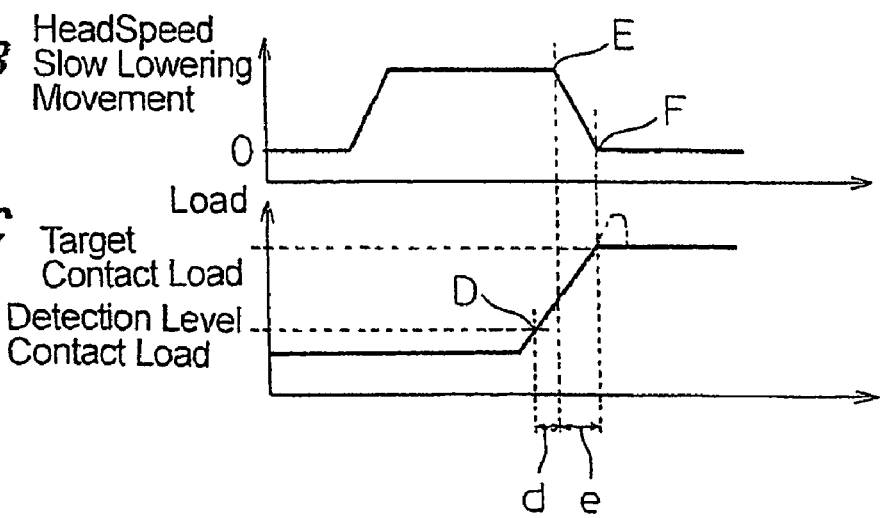
Fig. 7B
Fig. 7C

METHOD OF CONTROLLING CONTACT LOAD IN ELECTRONIC COMPONENT MOUNTING APPARATUS

TECHNICAL FIELD

The present invention relates to a method of controlling contact load between an electronic component and a substrate when mounting the electronic component held on a head onto the substrate set on a stage in an electronic component mounting apparatus.

BACKGROUND ART

In one of the methods of mounting electronic components such as bare IC chips on a substrate, the electronic component is held on a head while a substrate is set on a stage, and after the electronic component is positioned relative to the substrate, the head is lowered so that a bump on the electronic component makes contact with a corresponding electrode pad on the substrate, to bond the bump of the electronic component and the electrode pad of the substrate. In one bonding method, a certain load is applied between a gold bump provided on the electronic component and an electrode pad on the substrate, and ultrasonic energy with or without thermal energy is applied to bond the component on the substrate. In another method, solder bumps are provided on the electronic component, which are reflowed by applying thermal energy, after the bumps are brought into contact with electrode pads on the substrate, such that the bump is bonded to the pad by solder.

As the circuit wiring pitch in circuits of the electronic component is now in the order of nanometers, low dielectric constant materials are used for the interlayer insulating film. One problem with the low dielectric constant material is that it has low strength and may crack when subjected to a large load in the bonding process, which may lead to breakage of the electronic component. The load applied to the electronic component when its bump makes contact with the electrode pad on the substrate (hereinafter, referred to as contact load) in the process of lowering the head holding the electronic component onto the substrate can readily be too large, and this load poses a risk of damage to the electronic component using the above-noted low dielectric constant material because of a crack in the interlayer insulating film.

Now, an electronic component mounting method with a local reflow process using solder will be described with reference to FIG. 5A to FIG. 5D. In this method, discrete electronic components with solder bumps are mounted on a substrate, after which the electronic components are heated using a head to reflow and bond the solder bumps with electrode pads on the substrate.

Referring to FIG. 5A to FIG. 5D, an electronic component 31 having solder bumps 32 is held by a tool 30 on a head. A substrate 33 having electrode pads 34 on which solder or flux has been applied is carried in and set on a stage 35. The head is moved to position the solder bumps 32 of the electronic component 31 relative to the electrode pads 34 on the substrate 33, as shown in FIG. 5A. The head is lowered until the solder bumps 32 make contact with the electrode pads 34 as shown in FIG. 5B. The electronic component 31 is then heated with a heater disposed at the lower end of the head to reflow the solder bumps 32 so that the electrodes on the electronic component and the electrode pads 34 are bonded by the solder bonds 36, as shown in FIG. 5C. Then, the heating is stopped and the component is cooled to set the solder bonds 36, after which the head releases the electronic component 31 and goes up, as shown in FIG. 5D. After that, the substrate 33 on which the electronic component 31 is mounted is carried out from the stage 35.

FIG. 6 and FIG. 7A to FIG. 7C illustrate how the head is controlled in the process of lowering it until the component 31 (the solder bumps 32) make contact with the substrate 33 (the electrode pads 34) in this electronic component mounting method. The head is lowered at high speed from a predetermined waiting position to a slow down starting position, which is set at a position where there is no risk of accidental contact between the component and the substrate. From there the head is lowered at a low search speed of about 0.1 mm/s. The head has a build-in load cell for measuring the load in real time, and it is determined whether or not the load has reached a predetermined detection level of contact load. The lowering movement of the head is continued at the low speed until the load reaches the detection level, when it is slowed down and stopped. This way, the component is brought into contact with the substrate in a shortest possible time without the risk of applying an impact load when the component touches the substrate. After the electronic component makes contact with the substrate, the mounting head is controlled to repeat the steps of moving slightly and measuring the load, so that a predetermined load is applied to them (see Japanese Patent Laid-Open Publication No. 2003-8196).

In this process of bringing the component into contact with the substrate, however, as shown in FIG. 7C, the head is slowed down at a time point E, which is delayed by d from a time point D when a detection level contact load is detected. There is a time delay of e from the time point E to F when the head is stopped, as a result of which the contact load at the stop time point F is much larger than the contact load that was first detected. To be more specific, if a detection level contact load of 0.5 N is detected while the head is moving at a search speed of 0.1 mm/s, the load when the head is stopped will be as large as 2.0 to 3.0 N. Moreover, the load further increases and reaches a peak immediately after the head is stopped by the inertia of the head in a period of about 5 to 10 msec as indicated by an imaginary line in FIG. 7C. This large, instantly applied load may generate cracks in the interlayer insulating film made of low dielectric constant material and cause damage to the electronic component.

An object of the present invention is to solve the above-described problems in the conventional technique and to provide a method of controlling contact load in an electronic component mounting apparatus, with which the contact load applied on the components is precisely controlled to be as close as possible to a predetermined target contact load of a low level, so that electronic components using a low dielectric constant material can be mounted without the risk of damage.

DISCLOSURE OF THE INVENTION

To achieve the above object, the present invention provides a method of controlling contact load in an apparatus for mounting electronic components on a substrate, in which a head is lowered at high speed to a slow down starting position where there is no risk that the electronic component makes contact with the substrate, and from there the head is lowered at low speed until a predetermined target contact load is detected. This process of lowering the head at low speed includes the steps of moving down the head a predetermined distance, measuring load after the step of moving down the head, and determining whether the measured load has reached the target contact load. The steps of moving down the head and measuring the load are repeated until the measured load reaches the target contact load.

With this method, the head is moved down by a very small distance of, e.g., 0.2 to several µm, and the load is measured each time after the head is lowered. These steps of moving down the head by a predetermined distance and measuring the load are repeated until the measured contact load reaches a predetermined target level, whereby the contact load is precisely controlled to be close to a predetermined, very small level of, e.g., 0.4 to 0.6 N. Accordingly, electronic components using low dielectric constant material are mounted without the risk of damage.

The head is stopped for a set period of time after the step of moving down the head and before the step of measuring load so as to allow for the time required for measuring the load. This enables accurate real-time measurement of the load before the head is moved down in the next step, whereby precise control of the contact load is possible.

The distance by which the head is moved down in the step of moving down the head may be set variably in accordance with the predetermined target contact load. If the target contact load is large, the moving distance of the head in one lowering step is made large without making the error ratio of the contact load relative to the target contact load high, and the time required for the step of lowering the head at low speed is reduced. On the other hand, if the target contact load is small, the moving distance of the head in one lowering step is made small, so as to keep the error ratio of the contact load relative to the target contact load low, and to achieve precise control of the contact load.

The moving distance in the step of moving down the head is set at a first predetermined distance when the measured load is zero, and is set at a second predetermined distance after the load has exceeded zero, the second predetermined distance being smaller than the first predetermined distance. Thus, the head is lowered by a relatively large distance until the component makes contact with the substrate and a load of more than zero is detected. This way, the time required for the steps of lowering the head at low speed is reduced. After the contact, the head is lowered by a relatively small distance to achieve precise control of the contact load. A good balance is thus achieved between productivity and precision.

The second predetermined distance may be set variably in accordance with a difference between the measured load and the target contact load. This way, the head is lowered by a smaller distance as the load comes close to the target contact load, and the contact load is controlled more precisely.

If, after the load has exceeded zero, the measured load is the same as the previously measured one in the step of measuring load, the step of measuring load is repeated until a different load is detected. This is for preventing a drop in the control precision of the contact load, i.e., if the cycle time of the control routine is as fast as or faster than the load measuring time, the load measured before the previous lowering step may be detected as the current load, and if the head is lowered further by the predetermined distance based on this measurement, the contact load may largely exceed the target contact load.

BRIEF DESCRIPTION OF THE DRAWINGS

FIG. 5A to FIG. 5D are schematic diagrams illustrating the processes of a contact-ref low type electronic component mounting method;

FIG. 7A to FIG. 7C are graphs showing how the contact load changes with the head position and head speed in the conventional contact load control operation.

BEST MODE FOR CARRYING OUT THE INVENTION

One embodiment of a contact load controlling method in an electronic component mounting apparatus of the present invention will be hereinafter described with reference to FIG. 1 to FIG. 4.

Figure 1:
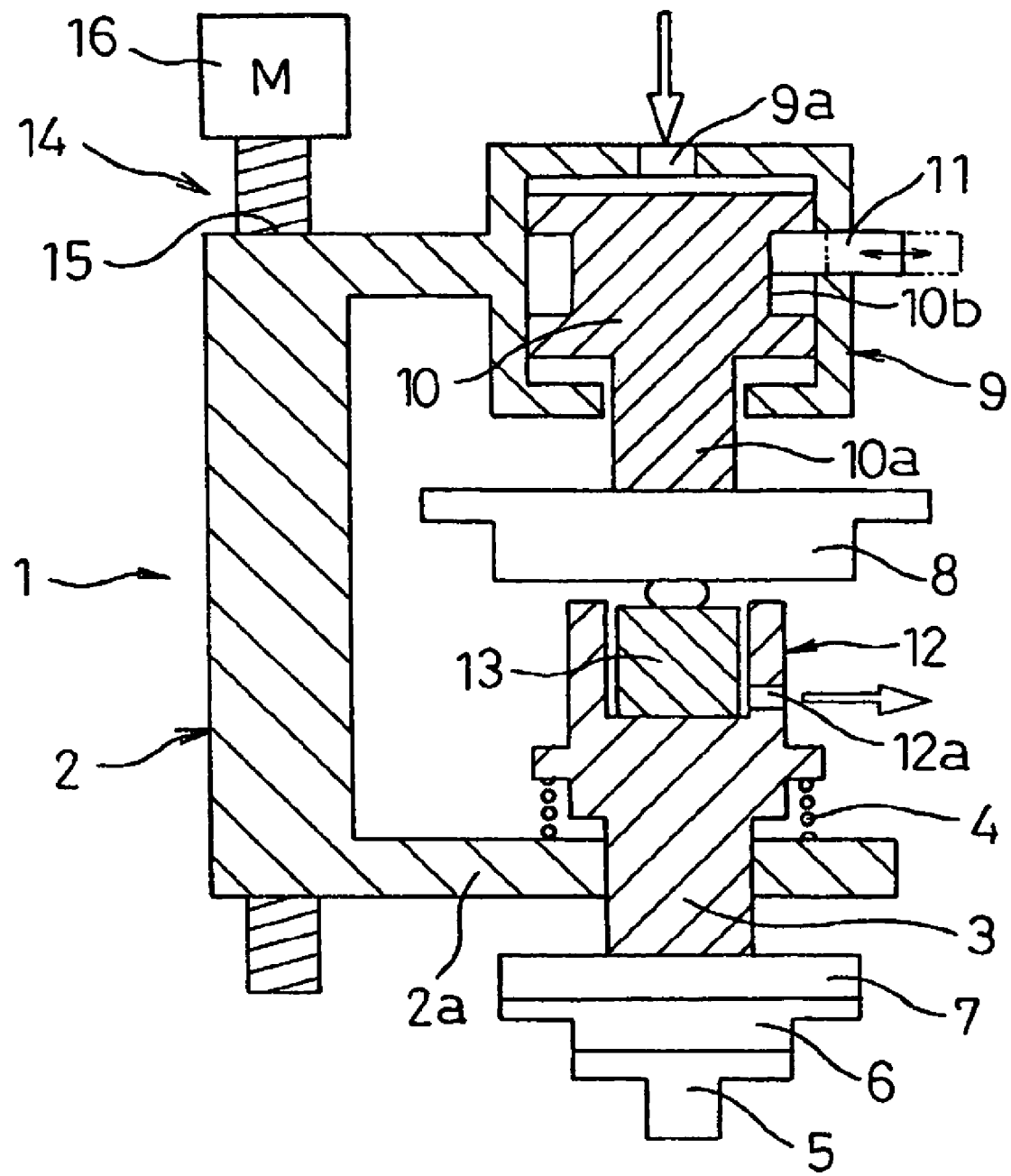
FIG. 1 is a schematic diagram illustrating the structure of a head in one embodiment of a method of controlling contact load in an electronic component mounting apparatus of the invention.

Referring to FIG. 1, 1 denotes a head in an electronic component mounting apparatus. A head body 2 that moves up and down includes a shaft 3 in a lower part thereof such as to be movable up and down. The shaft 3 extends down through a lower end support frame 2a of the head body 2 and is supported on the lower end support frame 2a via a spring 4 for counterbalancing the weight of the movable part including the shaft 3. To the lower end of the shaft 3 is provided a tool 5 for picking up an electronic component by suction. Heating means 6 such as a ceramic heater and a water-cooling jacket 7 for preventing heat transmission to the shaft 3 are arranged between the shaft and the tool. To the top of the shaft 3 is abutted a load cell 8 for measuring load. The upper end of the load cell 8 is abutted on the lower end of a large cylinder device 9 disposed above the head body 2.

The large cylinder device 9 includes a built-in piston 10 which is moved up and down by supplying and discharging compressed air through a port 9a at the upper end. A piston rod 10a extending from the lower end of the piston 10 makes contact with the load cell 8 at the distal end. A stopper 11 is disposed such as to be movable between an engaging position and a retracted position; it stops the lowering movement of the piston 10 by engaging with a recess 10b formed in the circumference of the piston 10. At the top of the shaft 3 is formed a cylinder chamber of a small cylinder device 12 with an open top, and a piston 13 that moves up and down in this cylinder chamber makes contact with the load cell 8 at the upper end. The cylinder chamber is provided with a port 12a through which compressed air is supplied or discharged to or from the lower part of the cylinder chamber. The large cylinder device 9 and small cylinder device 12 are used for applying a predetermined load to an electronic component when it is mounted. Since the contact load is controlled by adjusting the position of the head 1 in this embodiment, the shaft 3 is secured to the head body 2 and moves up and down with the head body 2. As shown in FIG. 1, compressed air is supplied through the port 9a of the large cylinder device 9 as indicated by the white arrow with the stopper 11 being protruded to the engaging position so as to secure the piston 10, and compressed air is discharged from the port 12a of the small cylinder device 12, so that the piston 13 is secured at lower end position of the cylinder chamber by the force of the spring 4.

A drive unit 14 for driving the head body 2 up and down is disposed on one side in parallel to the shaft 3. The drive unit 14 is made up of a feed screw mechanism 15 using a ball screw and a motor 16 for rotating the ball screw.

Figure 2:
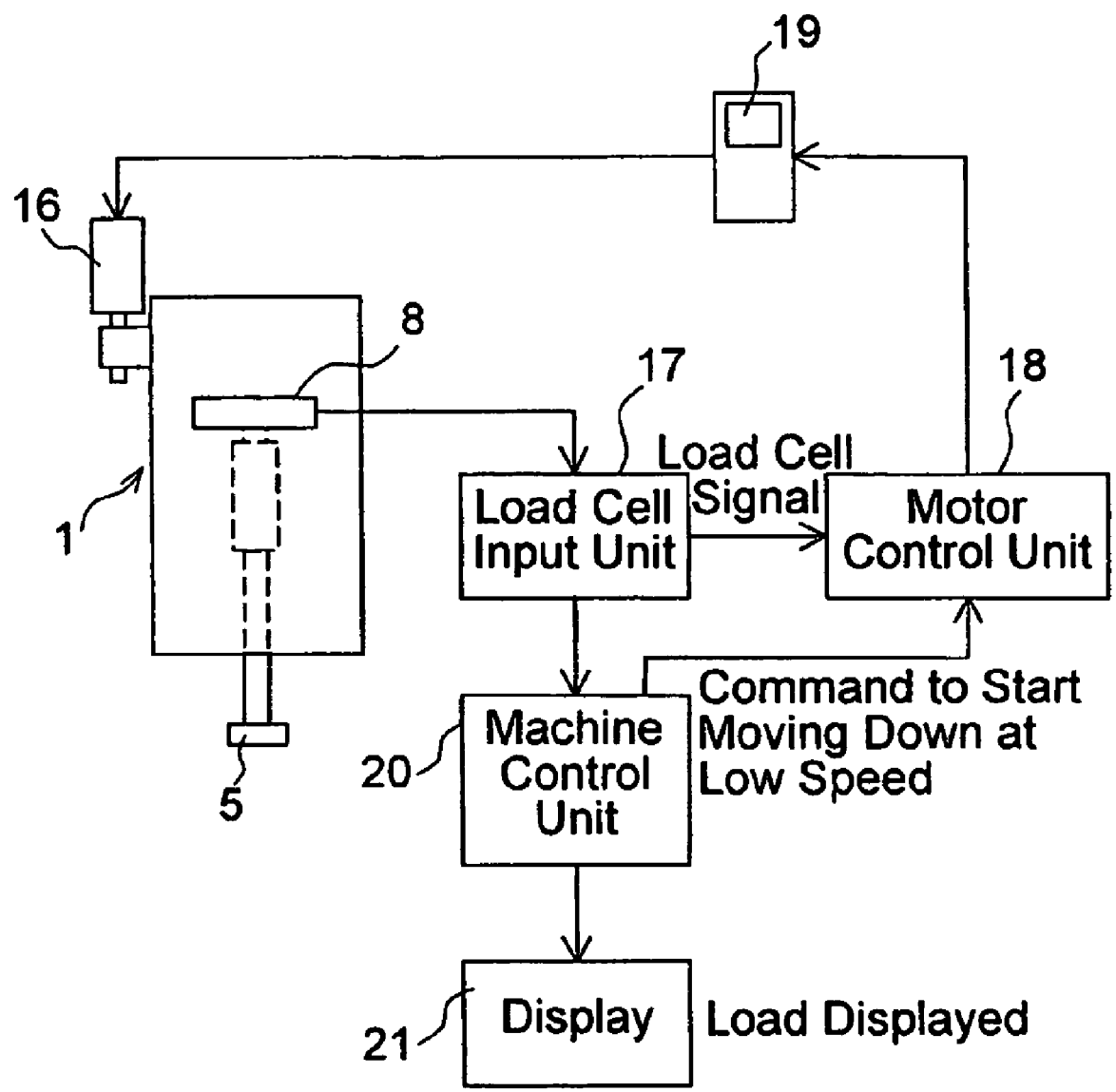
FIG. 2 is a diagram illustrating the structure of the contact load control system in the same embodiment.

FIG. 2 illustrates the control unit for controlling the contact load. A load cell input unit 17 reads an output voltage of the load cell 8 at a cycle of, e.g., 100 msec, and outputs the load cell signal, which is an analog voltage signal, to a motor control unit 18. When a command signal to start lowering movement at low speed is input from a machine control unit 20, the motor control unit 18 refers to the load cell signal and outputs a control signal to a motor driver 19 for driving the motor 16, based on a preset operation program.

The load cell signal is also input to the machine control unit 20 from the load cell input unit 17, so that the measured load is displayed on a display 21. The motor 16 is for moving the head body 2 up and down between a slow down starting position where there is no risk that the electronic component accidentally makes contact with the substrate and a position where the electronic component makes contact with the substrate. The head 1 is moved down at high speed from a waiting position to the slow down starting position by another lifting mechanism (not shown) controlled by the machine control unit 20. The machine control unit 20 outputs a command signal to start the slow lowering movement to the motor control unit 18 when it receives a detection signal indicating that the head has reached the slow down starting position.

Figure 3:
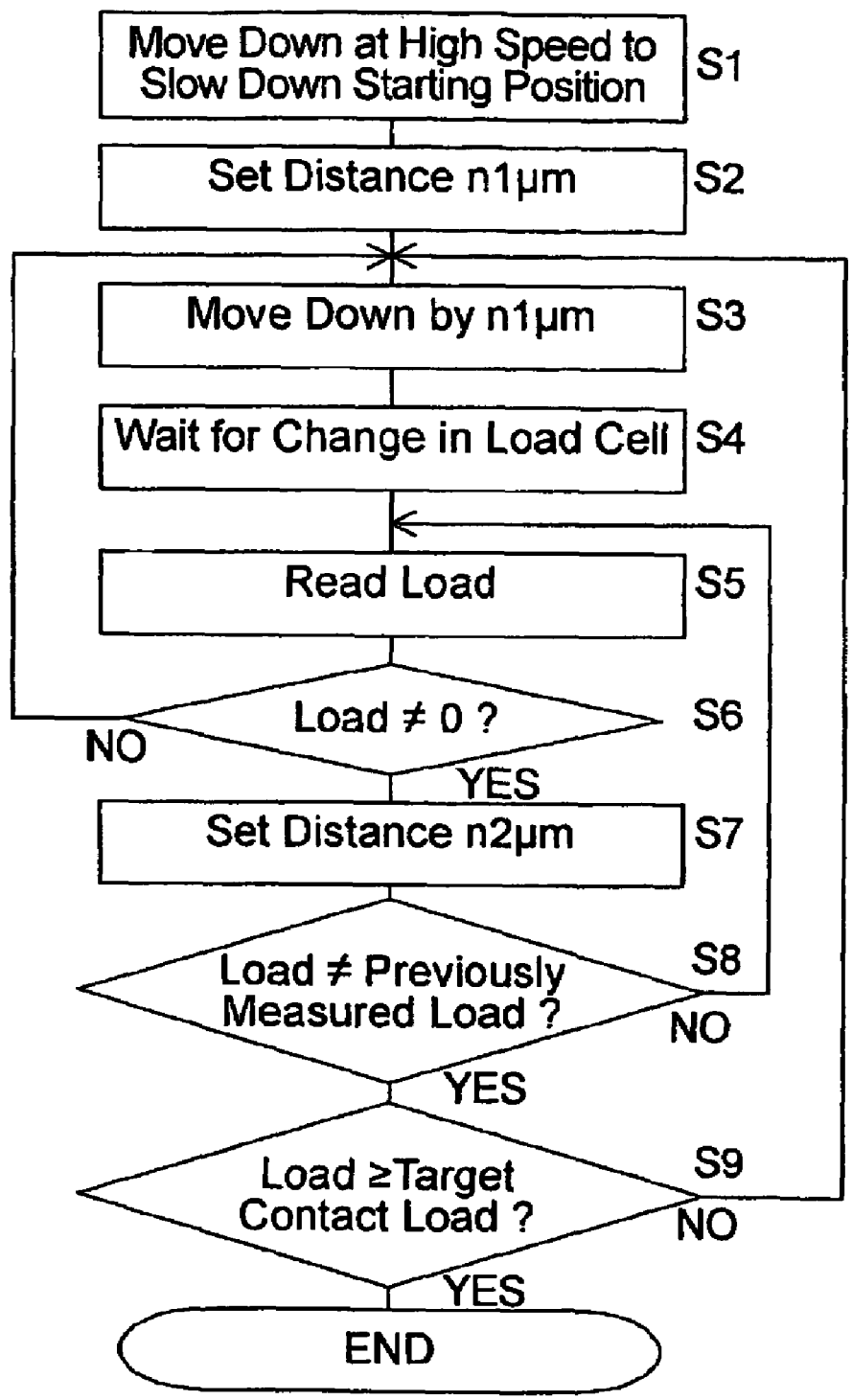
FIG. 3 is a flowchart of the contact load control operation in the same embodiment.
Figure 4:
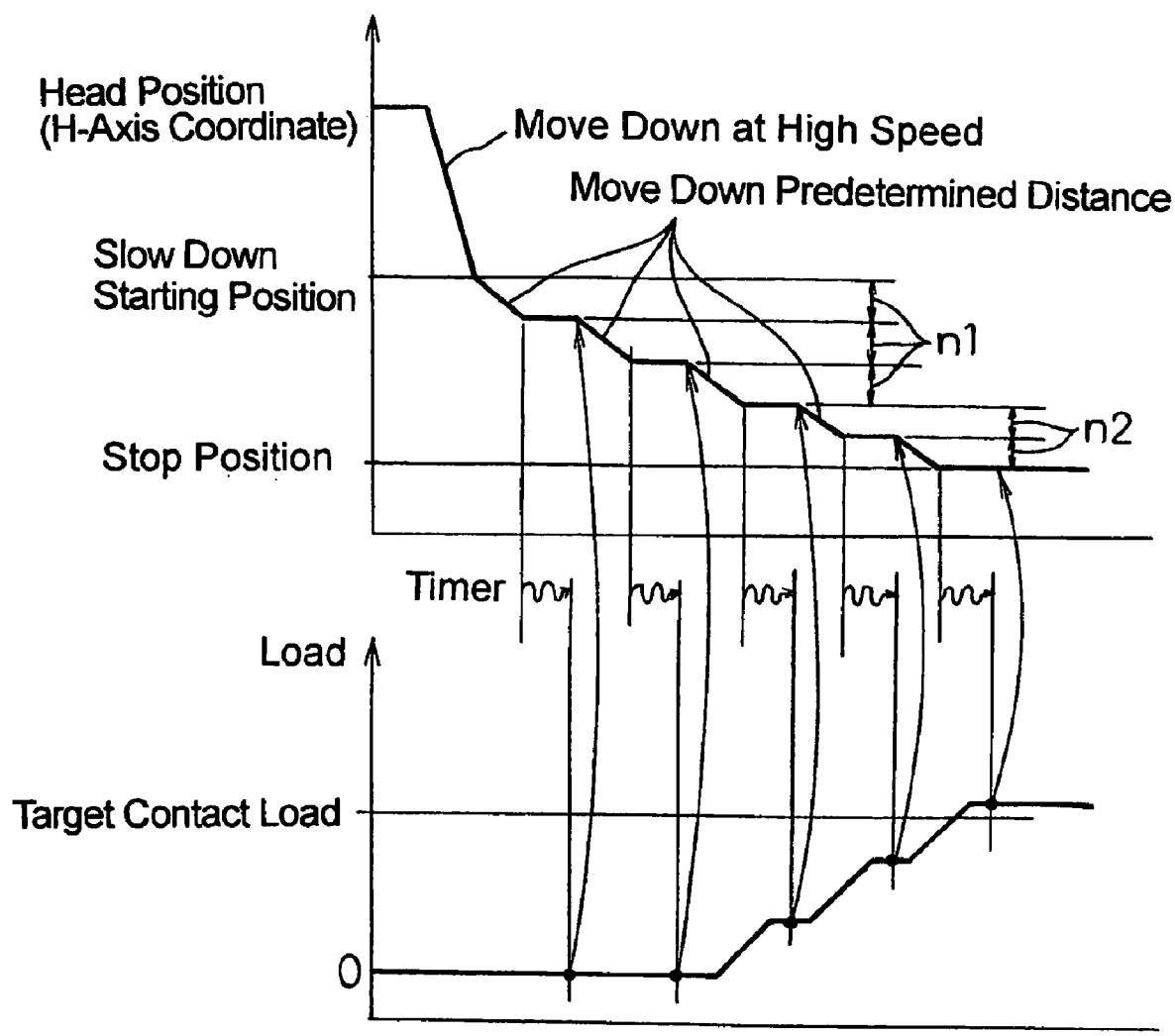
FIG. 4 is a graph showing how the contact load changes with the head position in the contact load control operation in the same embodiment.
Figure 6:
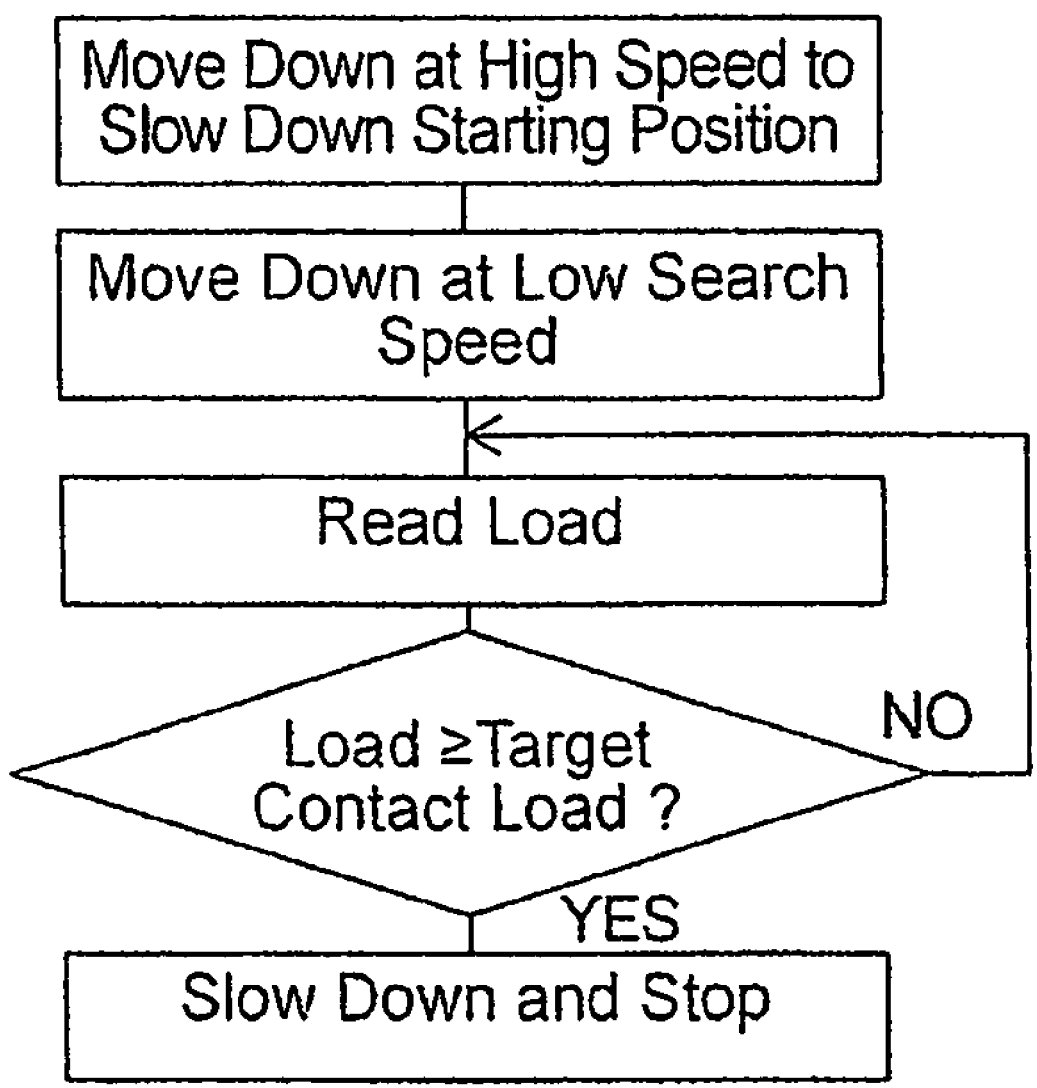
FIG. 6 is a flowchart of a conventional contact load control operation.

Next, how the contact load is controlled by controlling the drive of the motor 16 through the motor control unit 18 is described with reference to FIG. 3 and FIG. 4. First, the head is lowered at high speed to the slow down starting position (step S1) as noted above. The predetermined distance n by which the head is lowered is set to be n1 of, e.g., one to several µm (step S2). The motor 16 is driven to lower the head body 2 or the electronic component held by the tool 5 by the predetermined distance n (or n1) (step S3). The head is stopped for a set period of time of, e.g., several tens msec using a timer, for waiting a change in the signal from the load cell 8 (step S4). The load cell signal is then read (step S5), and it is determined whether the measured load is zero or not (step S6). If the load is zero, the steps S3 to S6 are repeated, i.e., the head is lowered by n1 and the load is read repeatedly until a load more than zero is detected.

When the load exceeds zero at step S6, the predetermined distance n by which the head is lowered is set to be n2 of, e.g., 0.2 to 1.0 µm (step S7). Then, it is determined whether or not the load is the same as the load that was detected in the previous step (step S8). As the load here is usually not the same as the previously detected one, the process goes to the next step S9 where it is determined whether the load has reached a predetermined target contact load of, e.g., 0.5 N (step S9). If the load has not reached the target contact load, the process goes back to step S3, and the steps S3 to S9 are repeated, i.e., the head is lowered by n2 and the load is read repeatedly until the load reaches the target level. When it is determined that the load has reached the target level at step S9, the slow lowering movement is stopped. Thus the contact load between the electronic component and the substrate is precisely controlled to be close to the predetermined target contact load.

If the load is the same as the previously detected one in step S8, the head is not moved further down and the process goes back to step S5 to repeat reading the measured load. This is for preventing a drop in the control precision of the contact load: If the cycle time of the control routine is as fast as or faster than the load measuring time, the load measured before the previous lowering step may be detected as the current load, and if the head is lowered further by the predetermined distance based on this measurement, the contact load may largely exceed the target level.

According to the embodiment described above, the head is moved down by a very small distance of, e.g., 0.2 to several µm, and the load is measured each time after the head is lowered. These steps of moving down the head by a predetermined distance and measuring the load are repeated until the contact load reaches a predetermined target contact load, whereby the contact load is precisely controlled to be close to a predetermined, very small load of, e.g., 0.4 to 0.6 N. Accordingly, electronic components using low dielectric constant material are mounted without the risk of damage.

The predetermined distance n by which the head is moved down in the steps of lowering the head is set to be n1 (one to several µm) as long as the measured load is zero, and after the measured load has exceeded zero, it is set to be n2 that is smaller than n1 (0.2 to 1.0 µm), so that the head is lowered by a relatively large distance until the component makes contact with the substrate and a load of more than zero is detected. This way, the time required for the step of lowering the head at low speed is reduced. After the contact, the head is lowered by a relatively small predetermined distance to achieve precise control of the contact load. A good balance is thus achieved between productivity and precision.

While the second predetermined distance n2 is set to be a constant value in the above-described embodiment, it may be set variably in accordance with a difference between the measured load and the target contact load. This way, the head is lowered by a smaller predetermined distance as the load comes close to the target contact load, and the target contact load is controlled more precisely.

While the moving distance n in the step of lowering the head at low speed is set irrelevantly of the target contact load in the above-described embodiment, it may be set variably in accordance with the predetermined target contact load, using an appropriate conversion equation or referring to a preset table. If the target contact load is large, the moving distance of the head in one lowering step is made large without making the error ratio of the contact load relative to the target level high, and the time required for the step of lowering the head at low speed is reduced. On the other hand, if the target contact load is small, the moving distance of the head in one lowering step is made small, so as to keep the error ratio of the contact load relative to the target level low, and to achieve precise control of the contact load.

INDUSTRIAL APPLICABILITY

As described above, according to the method of controlling contact load in an electronic component mounting apparatus of the present invention, the moving distance of the head in one lowering step is set very small, and the load is measured each time after the head is lowered the distance. These steps of moving down the head by the predetermined distance and measuring the load are repeated until the contact load reaches a target contact load, whereby the contact load is precisely controlled to be close to the target contact load, which may be set very low. Accordingly, the invention is particularly applicable to the mounting of electronic components using low dielectric constant material, as such electronic components are mounted without the risk of damage.

The invention claimed is:

1. A method of controlling contact load in an apparatus for mounting electronic components on a substrate, in which a head holding an electronic component is lowered at a first speed to a first position where the electronic component does not contact the substrate, and is lowered at a second speed slower than the first speed from the first position until a predetermined target contact load is detected, the method comprising:

moving the head down by a predetermined distance at the second speed;

measuring contact load after moving the head down; and determining whether the measured contact load has reached the target contact load, the moving and measuring being repeated until the measured contact load reaches the predetermined target contact load, wherein the predetermined distance is set at a first predetermined distance when the measured contact load is zero, and is set at a second predetermined distanced when the measured contact load exceeds zero, the second predetermined distance being smaller than the first predetermined distance, wherein the head is incrementally moved downward without being moved upward, and wherein the head moves in increments of either the first predetermined distance or the second predetermined distance.

2. The method of controlling contact load in an apparatus for mounting electronic components according to claim 1, further comprising:

halting the head for a predetermined period of time after moving the head down and before measuring the contact load.

3. The method of controlling contact load in an apparatus for mounting electronic components according to claim 1, wherein the predetermined distance is adjustably set in accordance with the target contact load.

4. The method of controlling contact load in an apparatus for mounting electronic components according to claim 1, wherein the second predetermined distance is adjustably set in accordance with a difference between the measured contact load and the target contact load.

5. The method of controlling contact load in an apparatus for mounting electronic components according to claim 1, wherein, when the measured contact load is the same as the previously measured contact load after the measured contact load exceeds zero, the measuring of the contact load is repeated until a different contact load is measured.

6. The method of controlling contact load in an apparatus for mounting electronic components according to claim 1, wherein the predetermined distance is adjustably set such that the moving and measuring need be repeated until the measured contact load reaches the predetermined target contact load.

7. The method of controlling contact load in an apparatus for mounting electronic components according to claim 1, wherein the predetermined distance is adjustably set within a range of 0.2 µm to several µm.

* * * * *